United States Patent
Shah et al.

(10) Patent No.: US 7,235,972 B2
(45) Date of Patent: Jun. 26, 2007

(54) **KEYHOLE ECHO-PLANAR IMAGING WITH DOUBLE (T1 AND T2*) CONTRAST (DC-EPIC)**

(75) Inventors: N. Joni Shah, Jülich (DE); Maxim Zaitsev, Freiburg (DE); Martin Osmund Leach, Surrey (GB); David John Collins, Surrey (GB); James D'Arcy, Wolverhampton (GB)

(73) Assignee: Forschungszentrum Julich GmbH, Julich (DE)

( * ) Notice: Subject to any disclaimer, the term of this patent is extended or adjusted under 35 U.S.C. 154(b) by 0 days.

(21) Appl. No.: 10/514,801

(22) PCT Filed: May 14, 2003

(86) PCT No.: PCT/DE03/01547

§ 371 (c)(1),
(2), (4) Date: Aug. 8, 2005

(87) PCT Pub. No.: WO03/098249

PCT Pub. Date: Nov. 27, 2003

(65) Prior Publication Data

US 2006/0091882 A1    May 4, 2006

(30) Foreign Application Priority Data

May 15, 2002   (DE) ................ 102 21 795

(51) Int. Cl.
*G01V 3/00* (2006.01)
(52) U.S. Cl. ................ 324/309; 324/307
(58) Field of Classification Search ................ 324/309, 324/307
See application file for complete search history.

(56) References Cited

U.S. PATENT DOCUMENTS 5,754,046 A * 5/1998 Busch et al. ................ 324/309
6,002,254 A   12/1999 Kassai et al.
6,400,151 B1 * 6/2002 Haase et al. ................ 324/309
6,781,372 B2 * 8/2004 Shah et al. ................ 324/307

OTHER PUBLICATIONS

Shared k-Space Echo Planar . . . by Zaitsev et al. (Magnetic Resonance in Medicine, 2001).
Spatial Frequency (Wikipedia, the free encyclopedia, Oct. 2004).
Spatial Frequency (Eric W. Weinstein, Oct. 2004).

* cited by examiner

*Primary Examiner*—Louis M. Arana
(74) *Attorney, Agent, or Firm*—Andrew Wilford

(57) ABSTRACT

An object is examined by detecting properties of the object at different times within a space formed by spatial frequencies. This is done such that temporally consecutive recordings are made in overlapping regions of the spatial frequency space and also in regions of the spatial frequency space that differ from one another.

8 Claims, 9 Drawing Sheets

KEYHOLE ECHO-PLANAR IMAGING WITH DOUBLE (T1 AND T2*) CONTRAST (DC-EPIC)

CROSS REFERENCE TO RELATED APPLICATIONS

This application is the U.S. national phase of PCT application PCT/DE03/01547 filed 14 May 2003 with a claim to the priority of German patent application 10221795.5 itself filed 15 May 2002.

FIELD OF THE INVENTION

The invention relates to a method for examining at least one object, in which properties of the object are detected within a spatial frequency space formed by spatial frequencies in various measurements.

BACKGROUND OF THE INVENTION

Examinations of the spatial frequency space find widespread use in many technological fields. Since momentum spaces correspond to spatial frequency spaces, the term spatial frequency space also includes momentum spaces. The designation spatial frequency space serves to clarify that the invention also relates to methods in which no momentum transfer takes place.

A known problem in recoding spatial frequency spaces is that, when a high spatial resolution is combined with a high spatial frequency resolution, a very long measuring time is needed.

The keyhole process is a known procedure for solving this problem. In this process, a high-resolution image is acquired by acquiring the entire spatial frequency space at least at one point in time. In one or more further measuring steps, a central area of the spatial frequency space is recorded, which determines the contrast of the reconstructed image. Subsequently, the high-resolution image is joined mathematically to the image or images recorded of the central areas of the spatial frequency space in such a way that, even for another point in time or for other points in time, an image having a high-resolution effect is acquired with a contrast that corresponds to the point in time of the recording.

This known method entails the drawback that contrast changes between consecutive measurements can only be ascertained if they have a sufficiently large spatial extension.

This drawback is especially detrimental when functional parameters are to be acquired.

Thus, for example, in functional magnetic resonance imaging, there is a need for parameters that influence nuclear magnetic resonance signals to be acquired with the highest possible spatial resolution The invention relates especially to an imaging process for examining substances in which, by means of indirect nuclear spin interaction, a precession of nuclear spins with an additional phase angle relative to an already present precession is generated in an external magnetic field so that a transversal magnetization fans out perpendicular to the external magnetic field and so that a relaxation of the transversal magnetization with a relaxation time $T_2$ is generated.

Magnetic resonance imaging allows the various physiological parameters to be ascertained. Examples of this are the acquisition of regional cerebral blood volumes (rCBV) and regional cerebral blood flow (rCBF).

With known perfusion experiments, examinations are carried out subsequent to an intravenous injection of a contrast agent, for example, a gadolinium chelate such as Gd-DTPA or Gd-BOPTA.

OBJECT OF THE INVENTION

The invention is based on the object of improving a method of the generic type in such a way that a rapid and reliable examination of the properties of the object with a high local and temporal resolution is made possible.

SUMMARY OF THE INVENTION

According to the invention, this object is achieved in that a method of the generic type is carried out in such a way that, after a first HF excitation, at least two measurements are made in identical areas of the spatial frequency space, whereby the measurements acquire the object in a central area (KEY) of the spatial frequency space at a high acquisition rate and in peripheral areas of the spatial frequency space at a lower acquisition rate than in the central area (KEY), whereby the first measurement is made within a time interval after the HF excitation, the interval being selected in such a way that the first measurement is essentially $T_1$-weighted, that a second measurement is made within a later time interval, whereby the later time interval is selected in such a way that the second measurement is essentially $T_2^*$-weighted, that subsequently an additional HF excitation is performed, that after the additional HF excitation, at least two additional measurements are made in the same areas (B1, B2) that are different from the first areas (A1, A2), whereby the areas (B1, B2) likewise encompass the central area (KEY) of the spatial frequency space having a high acquisition rate and peripheral components of the spatial frequency space having a lower acquisition rate than the central area (KEY), whereby the first measurement made after the additional excitation is made within a time interval after the additional HF excitation, which is selected in such a way that the first measurement is essentially $T_1$-weighted, in such a way that an additional measurement after the additional HF excitation is made within a later time interval, whereby the additional time interval is selected in such a way that the additional measurement is essentially weighted with $T_2^*$ and that subsequently, the measurements weighted with $T_1$ are combined to form one image and the measurements weighted with $T_2^*$ are combined to form an additional image.

In particular, the invention provides for examining individual areas of the spatial frequency space at a different frequency, whereby it is advantageous for the measurements of the areas to be made with at least three different acquisition frequencies.

Preferably, at least one, for example, centrally situated, area of the spatial frequency space is acquired in several measurements, whereas other areas are only acquired in one single measurement recording.

It is advantageous to carry out the method in such a way that a central area of the spatial frequency space is covered several times by identical measuring scans and that other areas are acquired in consecutive measurements that are locally different but that cover the same spatial segments. These segments are preferably formed by SPARSE areas. They are characterized in that they each have high-frequency areas having the same sign of the spatial frequency.

An advantageous embodiment of the method is characterized in that the additional, preferably not central, areas in the spatial frequency space are at a distance from each other that is greater than what would correspond to their spatially frequent extension in the direction of the central area.

It is advantageous to carry out the method in such a way that the additional areas of the spatial frequency space extend parallel to each other, at least in certain sections.

An advantageous embodiment of the method is characterized in that, with at least one measurement, the acquired areas form a disjunctive set.

Here, it is particularly advantageous for disjunctive elements of the individual sets to extend parallel to each other in the spatial frequency space, at least in certain sections.

An advantageous embodiment of the method is characterized in that the measurements are carried out in such a way that a cycle is formed in which at least some of the areas of the spatial frequency space that differ from each other are once again acquired in additional measurements.

BRIEF DESCRIPTION OF THE DRAWING

Additional advantages, special features and practical embodiments of the invention ensue from the subordinate claims and from the subsequent presentation of preferred embodiments of the invention with reference to the drawings.

The drawings show the following.

a) EPI recording of the entire spatial frequency space,
b) half-Fourier EPI measurement
c) EPIC acquisition of the entire spatial frequency space and
d) a half-Fourier EPIC measurement.

FIG. 4 depictions of four representative layers through the brain of a healthy test subject, whereby the measurements were carried out by means of echo planar imaging with keyhole (EPIC); here, images weighted with $T_1$ are shown in the upper line and images weighted essentially with $T_1^*$ are shown in the lower row;

FIG. 5 layers through the brain of a patient with a tumor, whereby a partial image a shows an image weighted essentially with $T_1$ and partial image b shows an image corresponding to partial image a, but weighted essentially with $T_2^*$;

calculated distributions for the regional cerebral blood flow rCBF and the regional cerebral blood volumes rCBV in the partial images c and d;

in partial image e, how a gamma variant function can be adapted to the acquired data.

SPECIFIC DESCRIPTION

Figure 1:
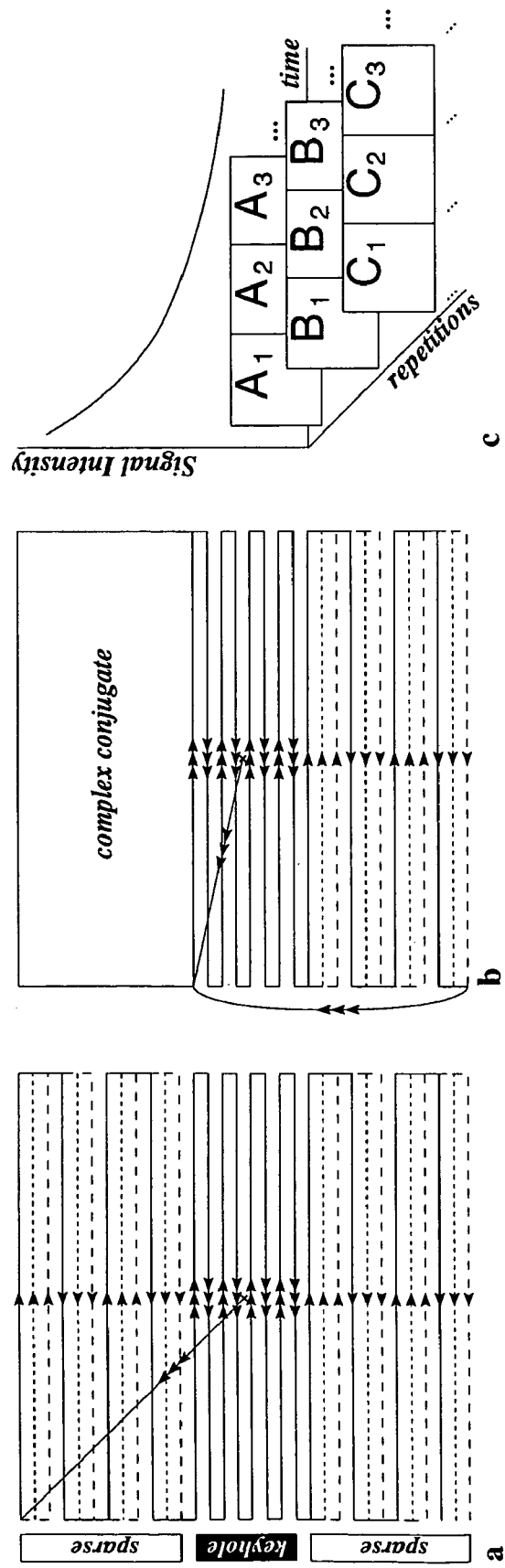
FIG. 1 in three partial images a, b and c, trajectories of the spatial frequency space for EPIC measurements and contrast-enhanced high-frequency EPIC examinations.

FIG. 1, partial image a, shows a planar echo image with keyhole of the type known, for example, from German patent application DE 199 62 845 A1.

A planar echo image with keyhole according to the invention is shown in FIG. 1, partial image b. With this echo imaging method according to the invention, an asymmetrical trajectory through the spatial frequency space is employed. The asymmetrical trajectory is configured in such a way that the data is acquired in a central area (keyhole), preferably while not acquiring at least one selected area of the spatial frequency space.

In an especially preferred embodiment, the data acquisition begins several lines above the center of the spatial frequency space. The lines extending above the center of the spatial frequency space to the center of the spatial frequency space are used to calculate a low-resolution phase image and for a half-Fourier reconstruction of image data.

Subsequent to the acquisition of the keyhole area of the spatial frequency space, a SPARCE sequence is performed with a compression factor s. Moreover, a keyhole factor k is introduced into the measurements. The keyhole factor k corresponds to the inverse value of the fraction of the spatial frequency space that comprises the keyhole. Thus, for example, if the central keyhole area comprises one-fourth of the spatial frequency space, then k=4. Subsequently, matrix elements of preferred half-Fourier echo planar imaging with keyhole (EPIC) is depicted. The depiction of the preferred embodiment relates to a acquisition of the spatial frequency space corresponding to a matrix with N×N dots.

When a sampling sequence EPIC<$n_{ov}$, k, s, i> is used, then $n_{ov}$ stands for the quotient of the number of lines acquired in the area of the keyhole and for the total number of acquired lines, k stands for the keyhole factor, s stands for the SPARSE factor and i is the running variable index wherein $0 \leq i < s$.

An especially preferred sampling sequence has the form:

$$\text{EPIC}<n_{ov},k,s,i>=[n_{ov},n_{ov}-1,n_{ov}-2,\ldots 0,1,2,\ldots -N/2/k+2,-N/2/k+1,\ldots -N/2+2s-i,-N/2+s-i] \quad [1]$$

The appertaining acquisition time TA for an acquisition module is:

$$TA = \Delta T^* N(n_{ov}(s+k-1)/(2 \cdot s \cdot k)) \quad [2]$$

The deliberations presented here are independent of the particular geometrical characteristics of the sample and of the structure of spatial frequency space. Therefore, the depicted image in FIG. 1, partial image b, is only to be understood by way of an example.

A simpler two-dimensional graphic depiction was selected although the invention is by no means limited to acquiring two-dimensional spatial frequency spaces but rather it is suitable for acquiring spatial frequency spaces having any desired dimensionality.

In a first measuring scan, a central area 1 as well as areas 10, of the spatial frequency space, here shown as solid lines, at a distance from the central area 1 are acquired, preferably essentially parallel to the spatial frequency space.

In a subsequent measurement, the central area is acquired once again. Moreover, additional areas 20—shown by dotted-dashed lines—of the spatial frequency space located outside of the central area 1 are acquired. The additional areas 20 of the spatial frequency space preferably extend parallel to each other and anti-parallel to the additional areas 10 acquired in the preceding measurement step.

Subsequently, the measuring procedure is repeated. During the repetition, once again, the central area 1 as well as other additional areas 30—dash-dot-dot lines—of the spatial frequency space are acquired.

Through a merely selective acquisition of high-frequency data, the time advantage entailed by a keyhole method is essentially retained. Moreover, noise effects are suppressed.

Furthermore, the images shown have a high spatial resolution, of the type corresponding to overall recordings of the spatial frequency space.

In particular, the invention calls for acquiring higher areas of the spatial frequency space at a lower recording rate. In order to nevertheless attain the desired high spatial resolution, at least one of the following methods is employed:

a) a distribution of measurements of high-frequency components of the spatial frequency space for various images recorded;

b) the use of a-priori information about the position and the type of anticipated intensity changes and the use of interpolation models for calculation purposes;

c) the use of parallel recording techniques in conjunction with suitable detector coils that are operated so as to be phase-shifted from each other.

Method c is easy to handle and can be carried out with little calculation effort. Moreover, this variant is especially robust, that is to say, not susceptible to disturbing influences.

Other methods available for acquiring the requisite information, however, can likewise be used.

A relatively small, or rather, infrequent acquisition of areas with high spatial frequency spaces achieves a time advantage and, what is especially advantageous, reduces correlations between images recorded over a time sequence.

Figure 2:
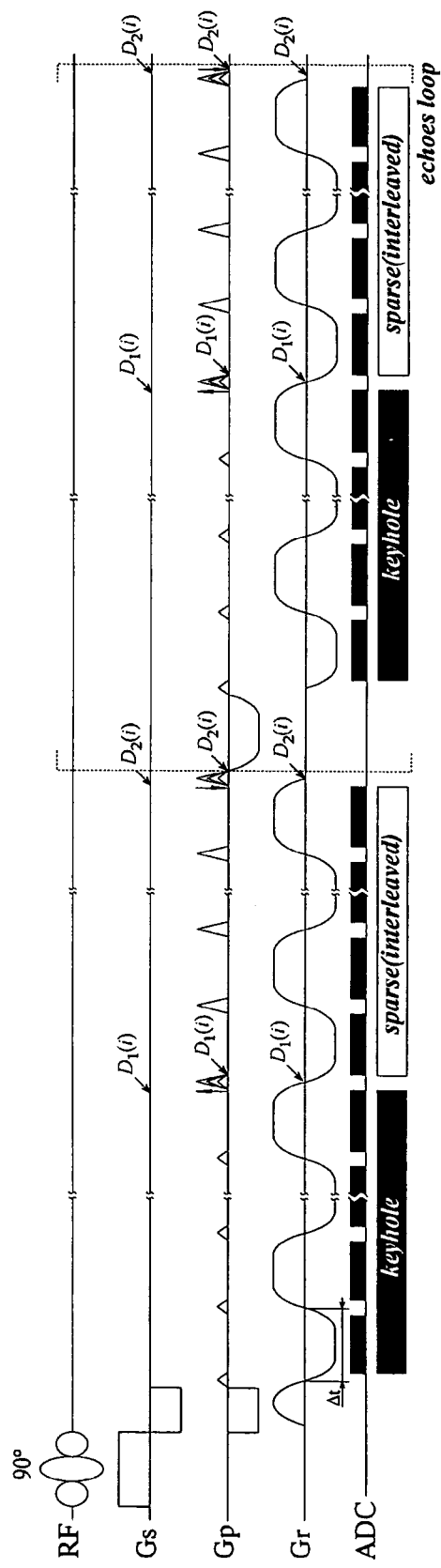
FIG. 2 a schematic representation of a measurement according to the invention carried out employing an EPIC method.

FIG. 2 shows a schematic representation of various components of a preferred recording sequence for a half-Fourier echo planar imaging method with multiple contrast according to the invention.

FIG. 2 shows various components of the sequence above each other in a time succession. Individual arrows each extending in a horizontal line indicate the time-dependence of individual parameters. The individual parameters are arranged above each other in such a way that simultaneous events are located directly above each other.

In the uppermost line, the applied, or resulting, field RF is shown in a line that depicts the time-dependence of the field and that corresponds to a pulse sequence.

Below the line indicating the time-dependence of the field, three lines are shown that depict a time-dependence of the gradient fields $G_S$, $G_P$ and $G_R$.

The first gradient field $G_S$ preferably extends in a main direction of a uniform magnetic field $B_o$. The magnetic field $B_o$ is also referred to as a polarization field and the axis of the uniform magnetic field is referred to as a z-axis. A layer of a sample to be examined is selected by means of the gradient field $G_S$. This is why the gradient field $G_S$ is also referred to as the layer selection gradient. For purposes of better distinguishing the various gradients from each other, the designation $G_S$ is used below for the layer selection gradient.

Below the first gradient field $G_S$, there is an additional gradient field that corresponds to a phase coding gradient $G_P$. The phase coding gradient $G_P$ preferably lies along a y-axis. It serves to select lines of a momentum space that is to be examined.

Below the additional gradient field, a third gradient field is shown that corresponds to a reading gradient $G_R$. The reading gradient $G_R$ preferably lies along an x-axis. It serves to read out signals, especially echo signals of the sample to be examined. In order to allow the reproduction of the signals in the form of an image, the reading gradient $G_R$ is used to carry out several recording sequences, shown above each other in FIG. 1.

Specifically, the method is carried out as follows:

First of all, a net magnetization of the sample to be examined is attained by an excitation pulse AP, preferably a 90° pulse, shown on the left of the topmost line. The excitation pulse AP has a duration, for example, of 1 to 10 milliseconds, whereby a duration of 2 to 3 milliseconds is especially preferred.

When the sample to be examined is excited by the excitation pulse, a first layer selection gradient $G_S1$ is applied to the sample and this leads to a partial dephasing of the transverse magnetization.

Subsequent to the excitation pulse, the spins are rephased again by an additional layer selection gradient $G_S2$ with a changed sign.

A time integral of the additional layer selection gradient $G_S$ is preferably half as large as the time integral of the first layer selection gradient $G_S1$ applied during the excitation pulse. As a result, the additional layer selection gradient $G_S2$ acts as a rephasing gradient.

The components of the sequence succession shown in FIG. 2 can, of course, also be used in other embodiments of the invention.

In particular, it is advantageous to use Echo Time Shifting (ETS) in order to generate artifact-free images.

Especially advantageous time shifts are referred to below as $D_1$ and $D_2$.

The first of these time shifts, which were designated as $D_1$ in FIG. 2 by way of an example, serves to eliminate step-like changes in the signal intensity and phase modulations between various layers. The magnitude of the time delay $D_1$ is preferably low at first and is subsequently increased. In an especially advantageous embodiment, the value of the time delay $D_1$ is at first equal to zero for the first recording and subsequently rises for each of the interleaves. The step magnitude here is preferably Dt/s. After several (N)—here three—interleaves, the entire k-space will have been acquired. The area of the keyhole is acquired N times in this process.

Another time shift $D_2=\Delta t(s-1)/s-D_1$ serves to make the length of the individual read-out components independent of individual measurements, especially of the number of the specific interleave.

Recording images without detrimental ghost effects is preferably done by a phase correction between straight and non-straight gradient echoes in order to reduce an influence of changes in the reading gradient $G_R$. Preferably, a phase vector is ascertained. This is done especially one pixel at a time. In an especially preferred embodiment, the phase correction vector is ascertained by a non-phase-coded calibration measurement. Preferably, the calibration measurement is carried out before the recording sequence.

It is surprising that a partial Fourier reconstruction of the image data, especially a half-Fourier transformation of the image data, is suitable for use in echo planar imaging since the embodiments shown, especially planar echo imaging methods with keyhole, entail a high risk of impairments caused by undesired phase shifts. The partial Fourier reconstructions are carried out under the assumption that phase shifts in the image have a low spatial resolution. However, this does not apply to the case at hand here of echo planar imaging with local influences of errors.

This is especially possible in that the number $n_{ov}$ of lines recorded in the areas having the opposite sign has a certain minimum value, preferably at least 12. It is even more advantageous to select a value for $n_{ov}$ of at least 16. Values between 16 and 32 for $n_{ov}$ are especially preferred.

By way of an example, the use of an especially advantageous half-Fourier echo imaging sequence will be described below.

In the especially preferred case, the half-Fourier EPIC pulse sequence is configured in such a way that it comprises the acquisition of several layers with contrast enhancement (especially double contrast).

Although the use of scanners with an especially high magnetic field strength is especially suitable, thanks to the advantages described regarding the resolution and the elimination of errors, the invention can also be used on commercially available scanners, for example, a Siemens Magnetom Vision 1.5 T.

Such a scanner has, for example, a standard gradient of 25 mT/m with a rise time of about 300 μs.

In especially preferred embodiments, read-out times in the order of magnitude of several hundred μs are used. In the case presented here, the read-out time is 880 μs. Through the read-out sequence, a matrix of 128×128 dots of the reconstructed image is acquired. Preferred echo times are in the order of magnitude of 10 ms to about 100 ms, preferably about 18 ms to 62 ms for the first and the second images.

The excitations of each layer were carried out with a generally known 1-3-3-1 volume fat suppression module.

Figure 3:
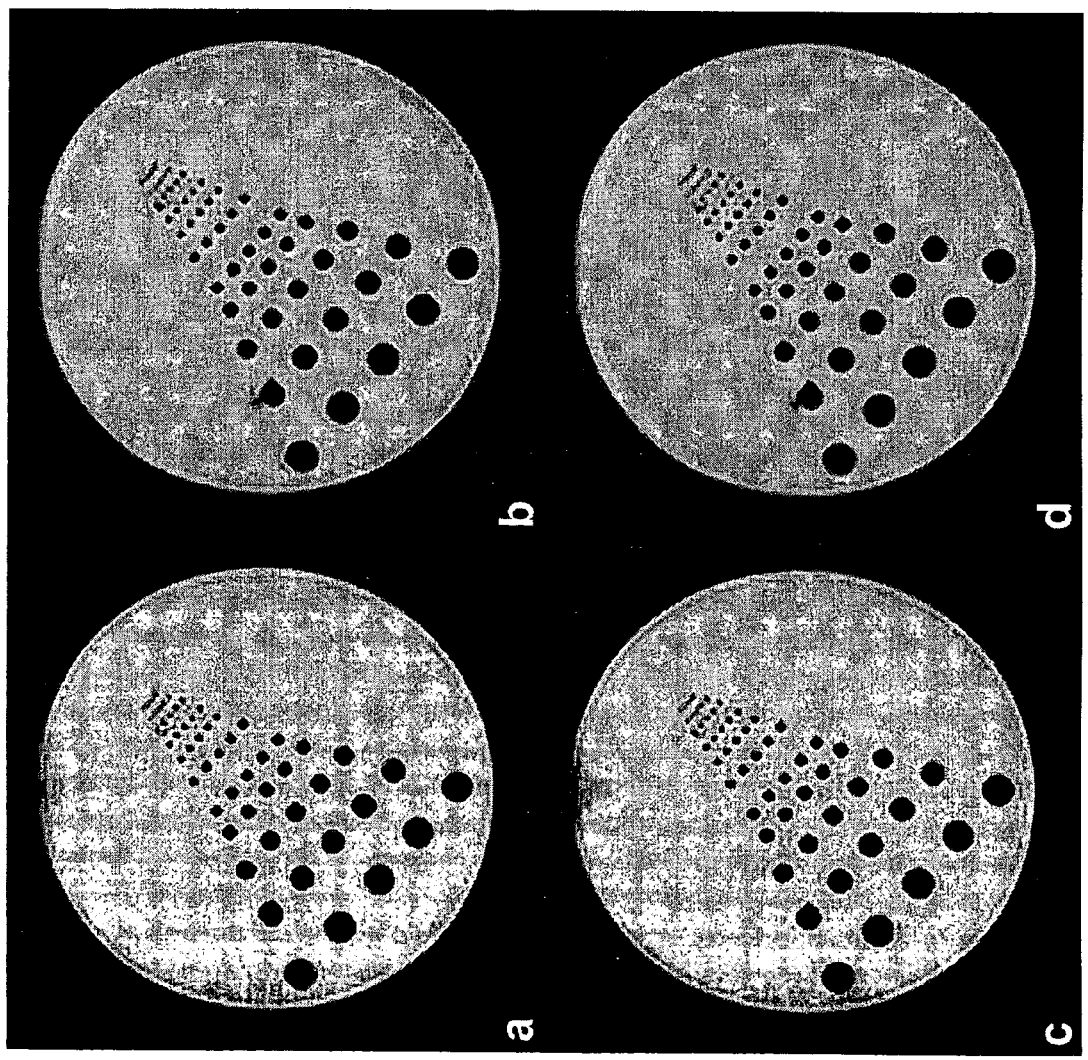
FIG. 3 in four partial images, the depiction of the resolution during the measurement of a phantom.
Figure 4A:
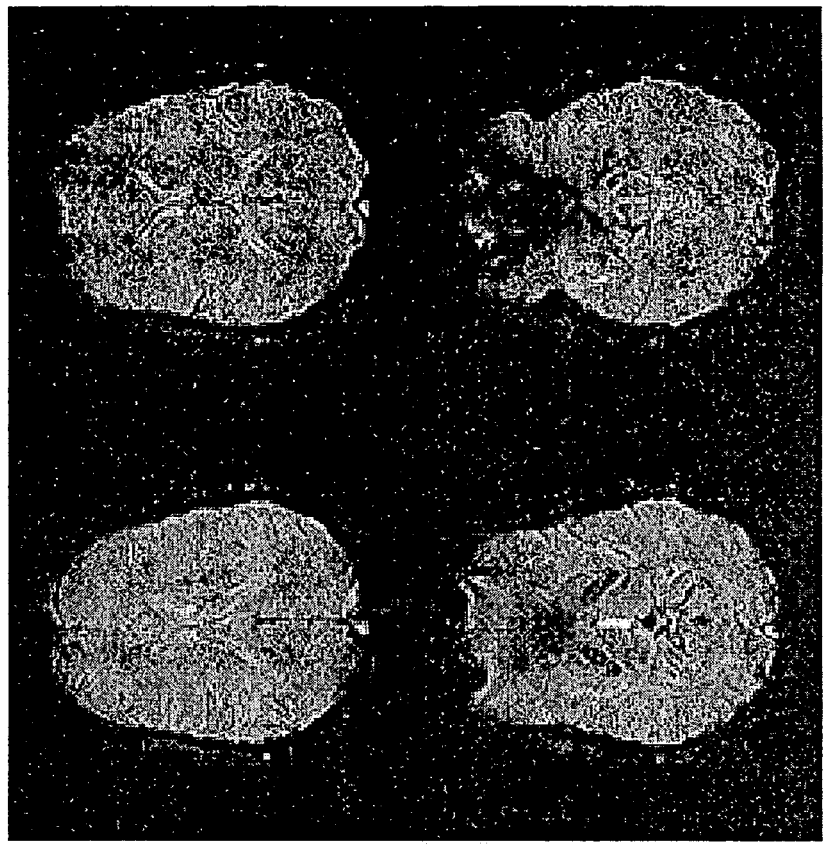
Figure 4A:
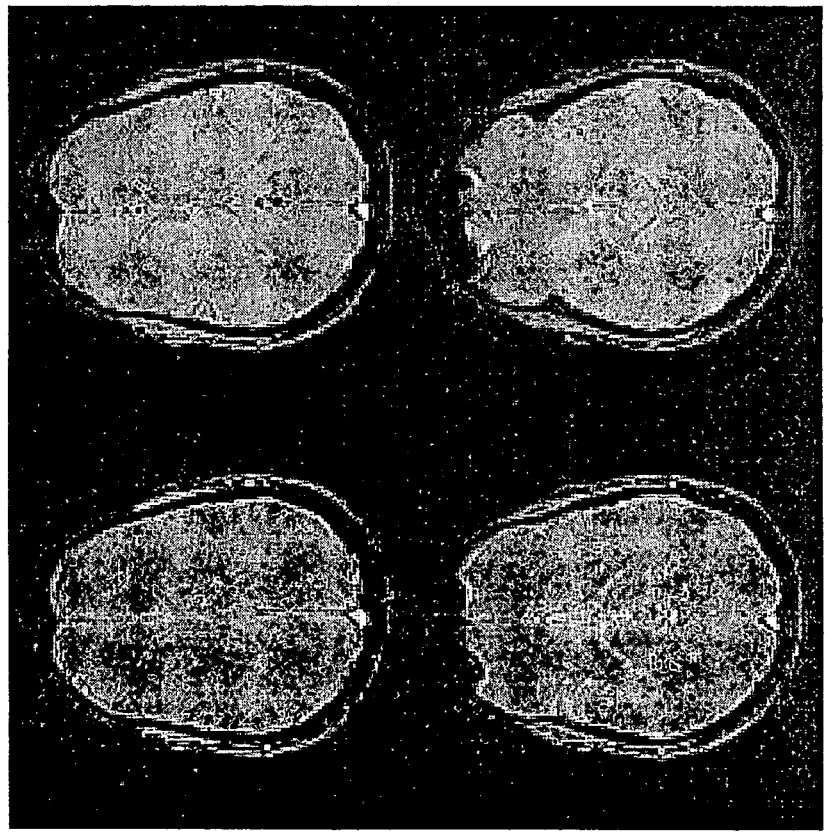
Figure 4B:
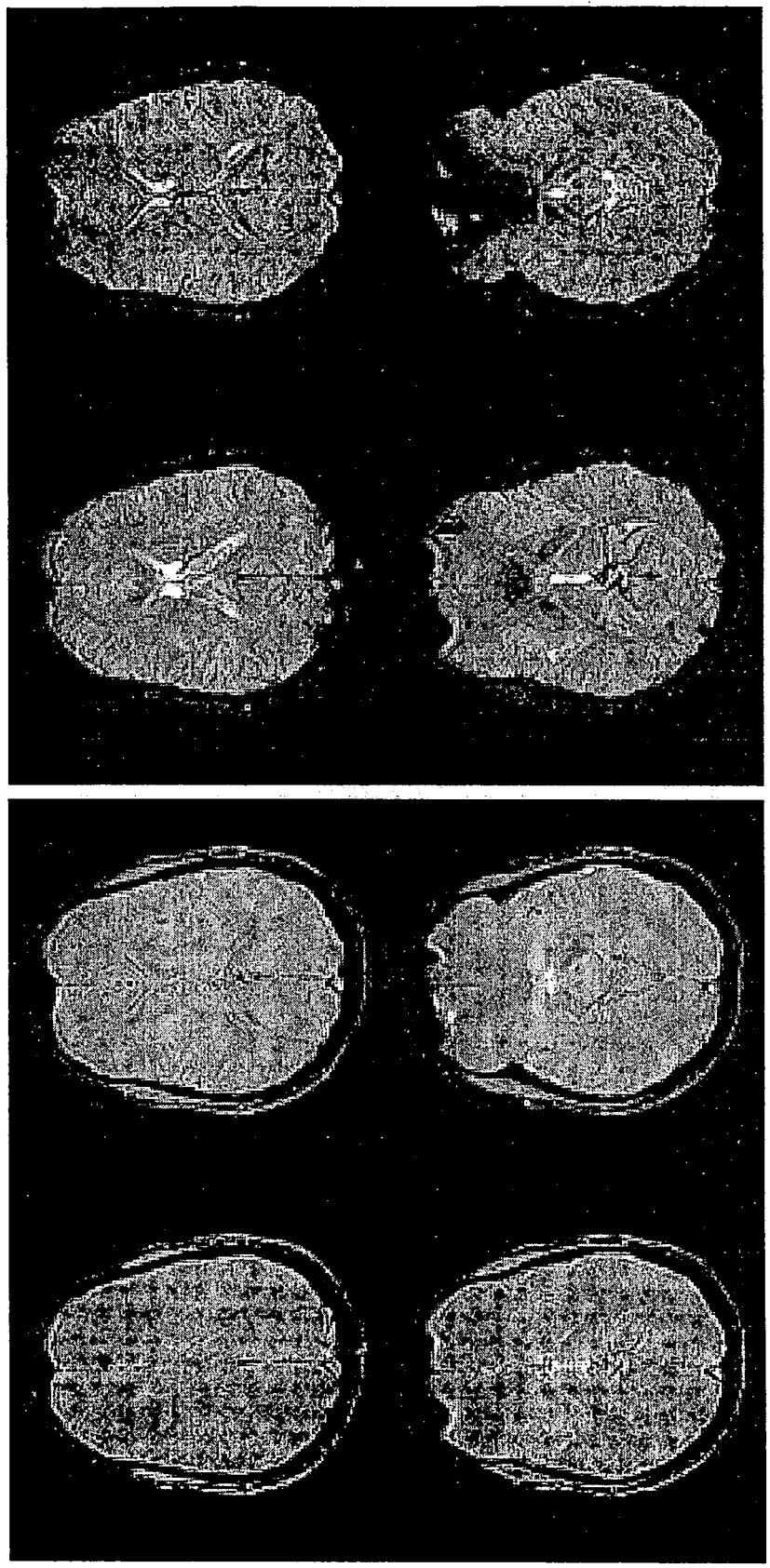
Figure 4C:
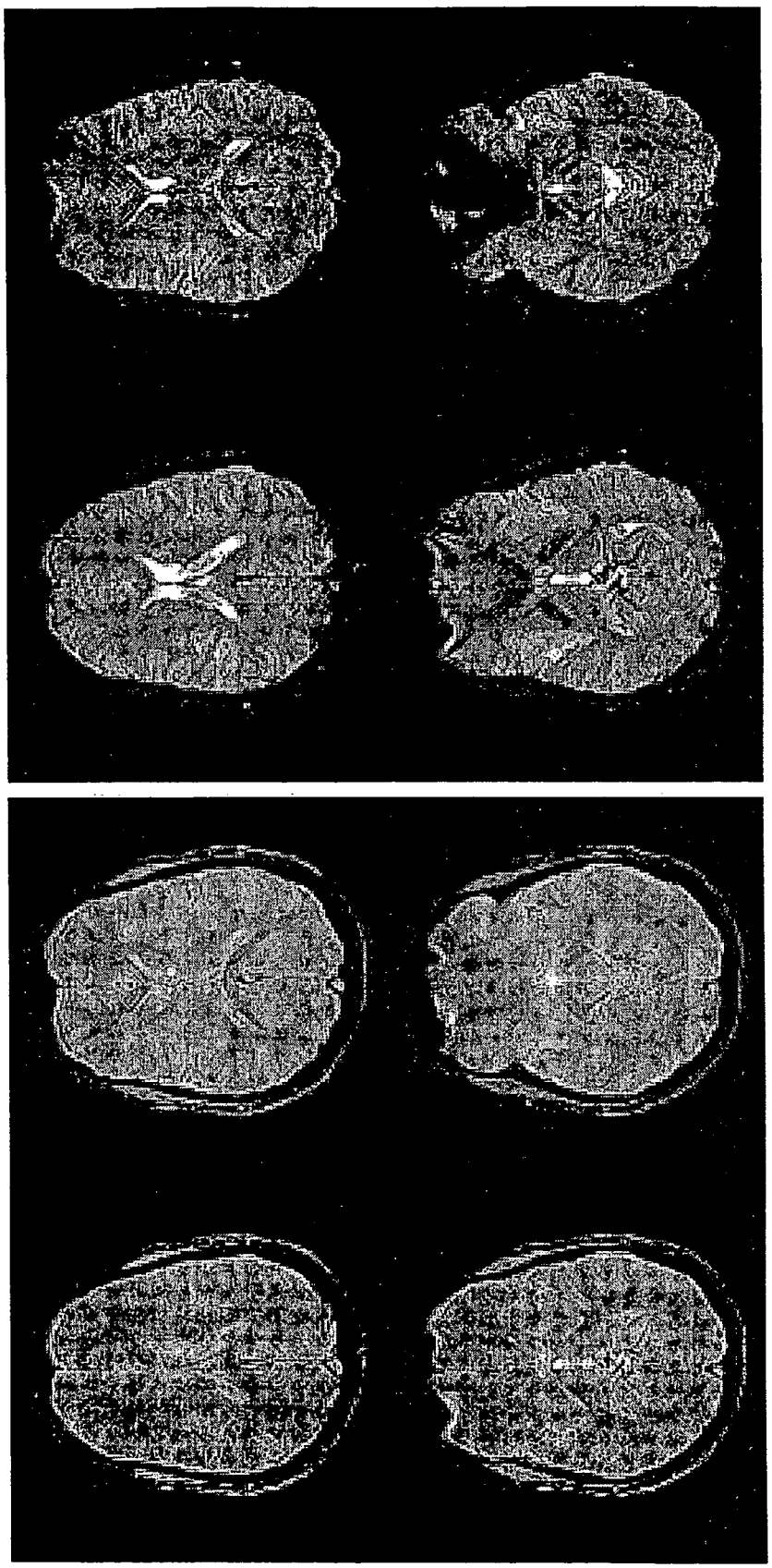

The measured results thus obtained are shown in FIG. 3.

FIG. 3 shows partial images in order to illustrate the resolution in four partial images during the measurement of a phantom.

The four partial images of FIG. 3 allow a presentation of the advantages of the invention with the example of measurements of a phantom. The half-Fourier double contrast echo planar imaging with keyhole is carried out in the embodiment shown in FIG. 3, partial image d, with echo times $T_{E1}$=18 ms and $T_{E2}$=62 ms as well as at an angle a=90°, FOV=200 mm, with a matrix size of 120×128 dots and a layer thickness of 4 mm without signal averaging. The sequence parameters for the other sequences, such as the matrix size, the layer thickness, the position and the higher of the echo times ($T_{E2}$=62 ms) remained unchanged.

All of the measurements were carried out with the same reading gradient. The examined phantom consists of several plastic containers of varying sizes that are placed into water.

The examinations of the human brain shown in FIG. 4 were carried out with a relaxation time $T_R$=1 s, a first echo time $T_{E1}$=18 ms, a second echo time $T_{E2}$=62 ms, a phase angle a=65°, with a matrix size of 128×128 dots and a layer thickness of about 4 mm without signal averaging. The same sequence is used to ascertain images averaged with the proton density before the dynamic studies. All of the sequence parameters preferably remain unchanged here except for the phase angle a, which is preferably reduced and is 10° in the case shown here. Furthermore, for these images weighted with the proton density, an averaging takes place over several signals, preferably 2 to 50, and 9 signals in the case shown here.

The images made with echo planar imaging with keyhole (EPIC) are recorded at a acquisition rate in the order of magnitude of 1 HZ and preferably with several hundred images, 144 in the case shown here.

Preferably, the first images—in the case shown here three images—are not taken into account because of saturation effects of $T_1$.

After a sufficiently long recording of a baseline lasting, preferably several seconds, especially 5 to 50 seconds, in the especially preferred case shown here, 15 seconds, a suitable contrast agent is administered, in this case, Gadolinium Pentadimeglumin (Gd-DTPA) in a suitable amount relative to the body of the test subject (approximately 0.1 mmol/kg of body weight).

Measurements of the relaxation time $T_1$ are carried out before the administration of the contrast agent, preferably with a small phase angle in the order of magnitude of about a=10°, followed by a dynamic measurement with D=65°. A preceding calibration measurement was used to calculate correct $T_1$ values and to acquire $T_1$-weighted images. Changes in the $T_1$ values of the measurements before the administration of the contrast agent—in the case shown here Gd-DTPA—are made by calculating the longitudinal relaxation of the contrast agent. This is preferably done taking into account a Levenberg-Marquardt algorithm. In this manner, a transfer-constant determination is achieved.

By using $T_1$-weighted and $T_2^*$-weighted images, disturbing influences that appear in the prior-art contrast methods are avoided.

By calculating g-functions, it is possible to determine relative cerebral blood volumes (rCBV), mean transit times (MTT), and cerebral blood flow (rCBF).

FIG. 3 comprises four partial images showing measurements of a phantom:

e) EPI recording of the entire spatial frequency space, f) half-Fourier EPI measurement, g) EPIC acquisition of the entire spatial frequency space and a half-Fourier-EPIC measurement.

The depictions in the partial images b and d show that image artifacts can be largely suppressed.

The depictions contained in FIG. 4 of four representative layers through the brain of a healthy test subject with varying weightings with $T_1$ show clear contrasts. In comparison to prior-art depictions, these depictions have a far better image quality with clearly recognizable structures.

The layer recordings shown in FIG. 5 of a patient with a tumor show that the tumor can be clearly recognized as a result of the process steps used.

Figure 5A:
Figure 5A:
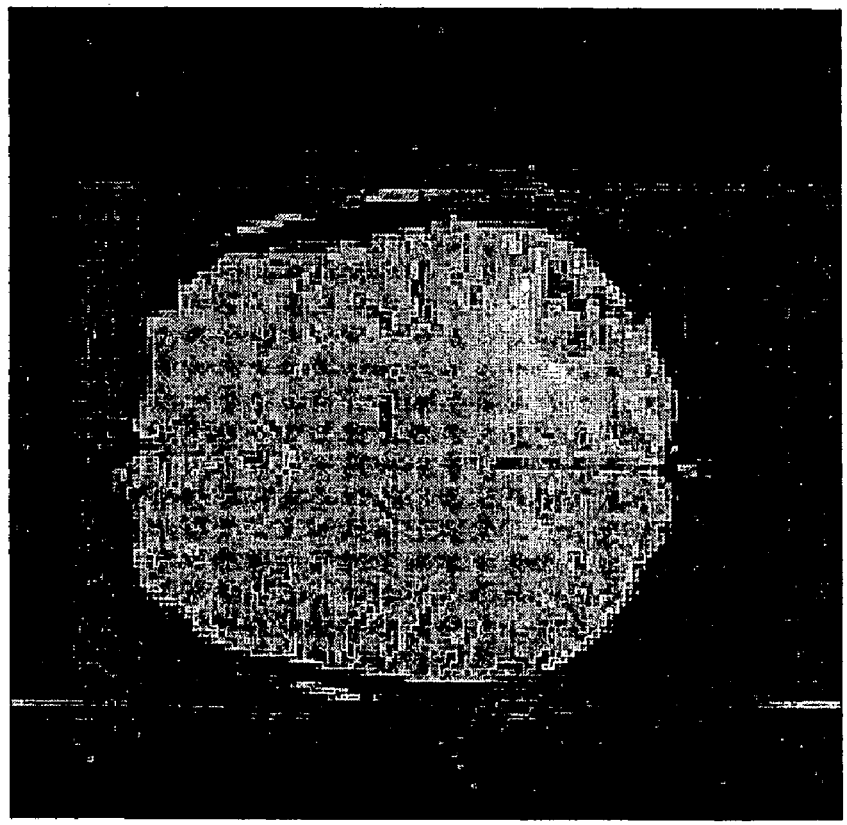
Figure 5B:
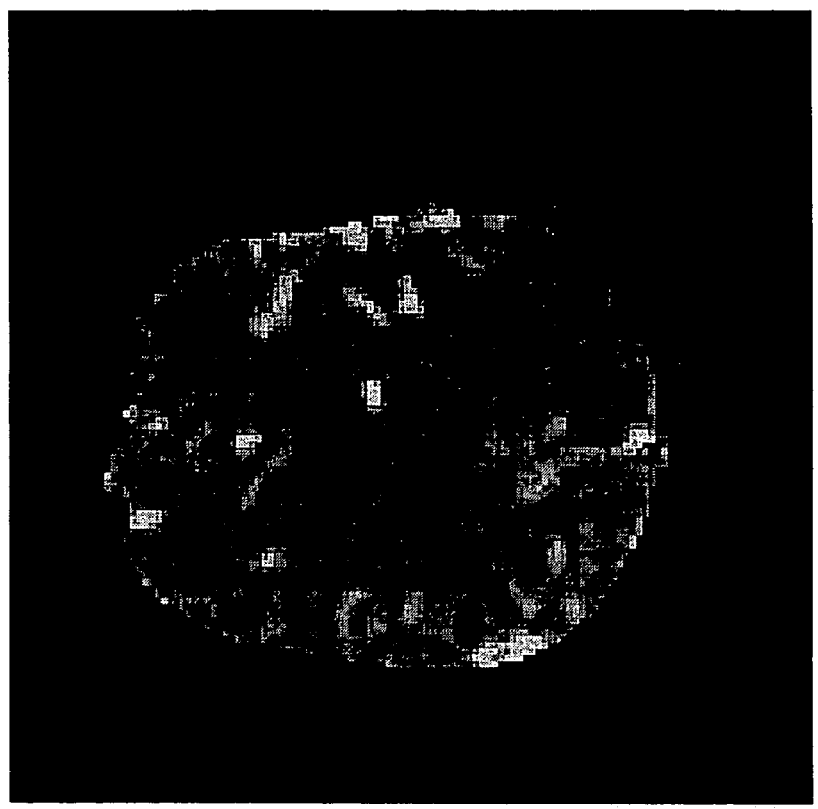
Figure 5B:
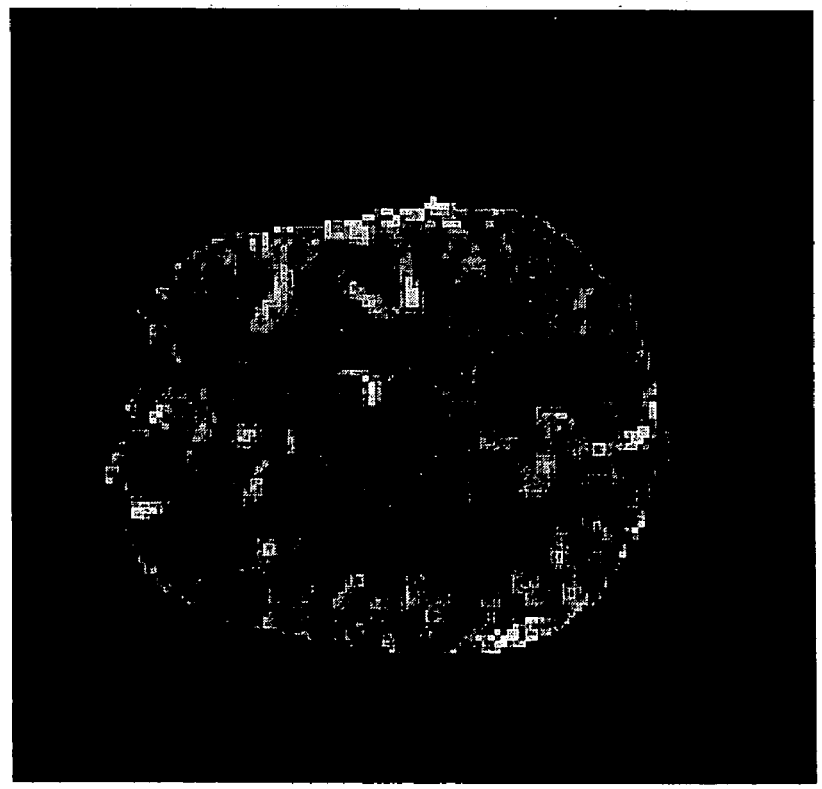

Here, the partial image shown in FIG. 5a is essentially $T_1$-weighted. The corresponding, essentially $T_2^*$-weighted image is shown in FIG. 5b. The data depicted, in combination with measurements of a baseline before the administration of the contrast agent, make it possible to determine the changes in the concentration of the contrast agent and to compare it with known models of permeability data of the contrast agent, for example, with reference to the Tofts model.

Figure 5C:
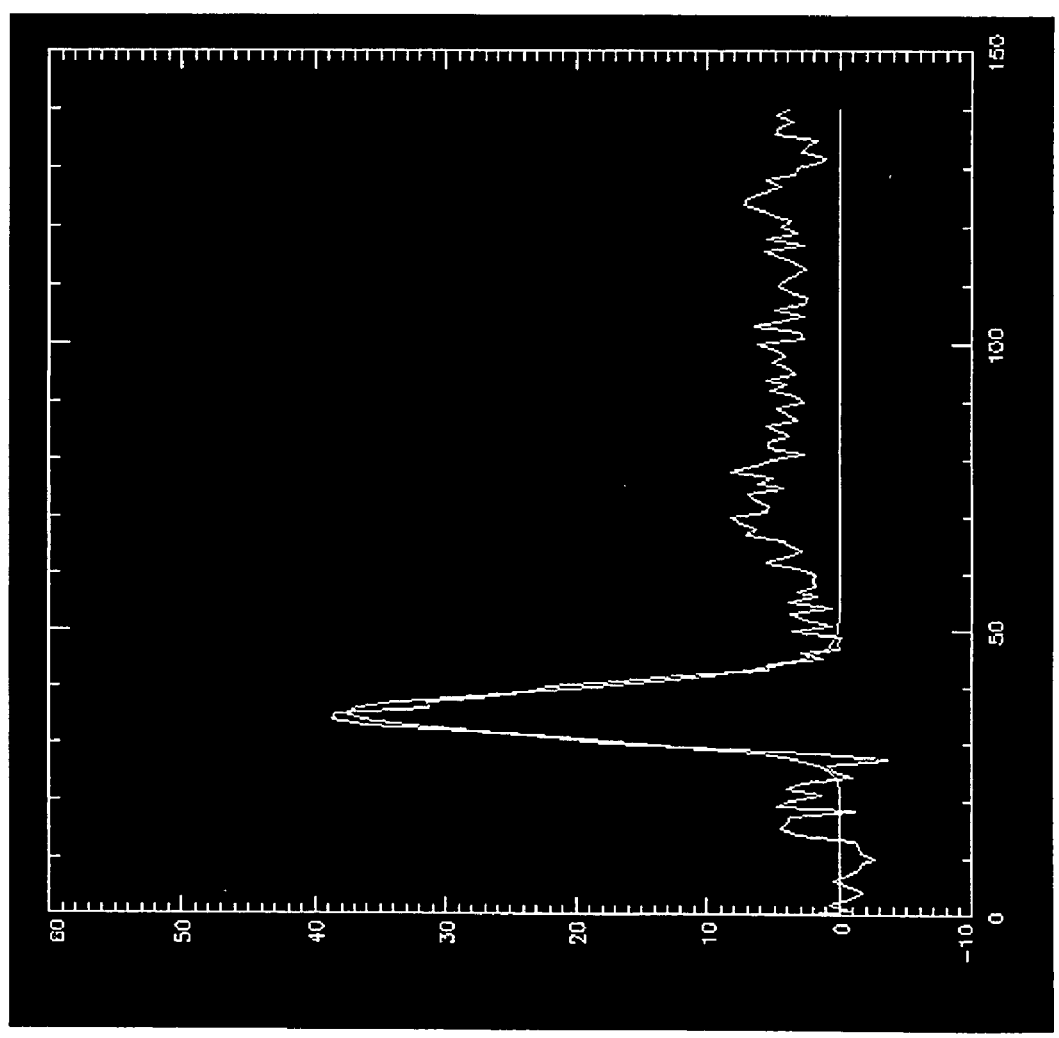

The partial images in FIG. 5c and FIG. 5d show the regional cerebral blood flow (rCBF) and the regional cerebral blood volumes (rCBV).

The partial image FIG. 5e shows a data adaptation of the g-functions to the data obtained.

By using double contrast EPIC measurements in order to examine time-dependent phenomena, for example, dynamic studies of the effect of the administration of contrast agents, a higher time resolution and a greater image contrast can be achieved. The spatial resolution of the double contrast EPIC measurements is higher than with the known echo planar imaging EPI.

Moreover, with the double contrast EPIC measurements employed, it is possible to adapt the SPARSE factor, the keyhole factor and the sampling factor to the desired measurement use and thus to achieve a desired temporal resolution and a certain degree of the reduction of susceptibility artifacts.

The invention claimed is:

1. A method for examining at least one object, during which properties of the object are detected within a spatial frequency space formed by spatial frequencies in various measurements, characterized in that after a first HF excitation, first and second measurements are made in first areas of the spatial frequency space, whereby the measurements each acquire the object in a central area of the spatial frequency space at a high acquisition rate and in peripheral areas of the spatial frequency space at a lower acquisition rate than in the respective central area of the spatial frequency space, whereby the first measurement is made within a time interval after the HF excitation, said interval being selected in such a way that the first measurement is essentially T1-weighted, that the second measurement is made within a later time interval, whereby the later time interval is selected in such a way that the second measurement is essentially $T_2^*$-weighted, that subsequently an additional HF excitation is performed, that after the additional HF excitation, at least two additional measurements are made in second areas that are different from the first areas, whereby the second areas likewise encompass the central area of the spatial frequency space having a high acquisition rate and peripheral components of the spatial frequency space having a lower acquisition rate than the central area, whereby the first measurement made after the additional excitation is made within a time interval after the additional HF excitation, which is selected in such a way that the first measurement is essentially $T_1$-weighted, that an additional measurement after the additional HF excitation is made within a later time interval, whereby the additional time interval is selected in such a way that the additional measurement is essentially weighted with T2* and that subsequently, the measurements weighted with $T_1$ are combined to form one image and the measurements weighted with $T_2^*$ are combined to form and additional image.

2. The method according to claim 1, characterized in that measurements of the first and second areas are made with at least three different acquisition frequencies.

3. The method according to claim 1, characterized in that the object is examined using a sampling sequence EPIC<$n_{ov}$, k, s, i>=[$n_{ov}$, $n_{ov}$ –, 1, $n_{ov}$ –2, . . . 0, 1, 2, –N/2/k+2, –N/2/k+1, –N/2+2s–i, –N/2+s–i], whereby $n_{ov}$ stands for the quotient of the number of lines acquired in the keyhole and of the total number of scanned lines, k stands for a keyhole factor, s stands for a SPARSE factor and i is a running variable index, and N stands for the number of times the keyhole is acquired.

4. The method according to claim 3, characterized in that the acquisition is carried out in acquisition modules with acquisition times TA for which the following applies:

$$TA = \Delta t * N\left(n_{ov} \frac{s+k-1}{2 \cdot s \cdot k}\right).$$

5. The method according to claim 1, characterized in that the first and second areas of the spatial frequency space extend parallel to each other, at least in certain sections.

6. The method according to claim 1, characterized in that, with at least one measurement, the acquired areas form a disjunctive set.

7. The method according to claim 6, characterized in that disjunctive elements of the individual sets extend parallel to each other in the spatial frequency space, at least in certain sections.

8. The method according to claim 1, characterized in that the measurements are carried out in such a way that a cycle is formed in which at least some of the areas of the spatial frequency space that differ from each other are once again acquired in additional measurements.

* * * * *